(12) United States Patent
Chang et al.

(10) Patent No.: US 8,536,029 B1
(45) Date of Patent: Sep. 17, 2013

(54) NANOWIRE FET AND FINFET

(75) Inventors: Josephine B. Chang, Mahopac, NY (US); Chung-Hsun Lin, White Plains, NY (US); Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/529,334

(22) Filed: Jun. 21, 2012

(51) Int. Cl.
*H01L 21/20* (2006.01)
*H01L 21/36* (2006.01)

(52) U.S. Cl.
USPC ............................................. 438/479; 257/29

(58) Field of Classification Search
USPC .......................................... 438/479; 257/79
See application file for complete search history.

(56) References Cited

U.S. PATENT DOCUMENTS

| 8,008,146 | B2 | 8/2011 | Bangsaruntip et al. | |
|---|---|---|---|---|
| 8,294,180 | B2 * | 10/2012 | Doyle et al. | 257/192 |
| 2008/0251862 | A1 | 10/2008 | Fonash et al. | |
| 2011/0133162 | A1 | 6/2011 | Bangsaruntip et al. | |
| 2011/0133167 | A1 * | 6/2011 | Bangsaruntip et al. | 257/24 |
| 2011/0278543 | A1 | 11/2011 | Bangsaruntip et al. | |
| 2012/0168724 | A1 * | 7/2012 | Park et al. | 257/29 |
| 2012/0313148 | A1 * | 12/2012 | Schultz | 257/288 |

OTHER PUBLICATIONS

U.S. Appl. No. 12/830,514, filed Jul. 6, 2010 entitled "A Process for Forming a Surrounding Gate for a Nanowire Using a Sacrificial Patternable Dielectric," inventors: Bangsaruntip et al. (not yet published).
D. Li et al., "Thermal Conductivity of Individual Silicon Nanowires," Appl. Phys. Lett., vol. 83, 2003, pp. 2934-2936.
R. Huang et al., "Characterization and Analysis of Gate-all-around Si Nanowire Transistors for Extreme Scaling," 2011 IEEE Custom Integrated Circuits Conference (CICC), Sep. 19-21, 2011, 8 pages.
R. Wang et al., "Experiemental Study on Quasi-Ballistic Transport in Silicon Nanowire Transistors and the Impact of Self-Heating Effects," IEEE International Electron Devices Meeting, IEDM 2008, Dec. 15-17, 2008, pp. 753-756.
S. Bangsaruntip et al., "High Performance and Highly Uniform Gate-All-Around Silicon Nanowire MOSFETs with Wire Size Dependent Scaling," 2009 IEEE International Electron Devices Meeting (IEDM), Dec. 7-9, 2009, pp. 297-300.
S. Bangsaruntip et al., "Gate-all-around Silicon Nanowire 25-stage CMOS Ring Oscillators with Diameter Down to 3 nm," 2010 Symposium on VLSI Technology (VLSIT), Jun. 15-17, 2010, pp. 21-22.

* cited by examiner

*Primary Examiner* — Kimberly Rizkallah
*Assistant Examiner* — Mounir Amer
(74) *Attorney, Agent, or Firm* — Cantor Colburn LLP; Vazken Alexanian

(57) ABSTRACT

A method includes thinning a first region of an active layer, for form a stepped surface in the active layer defined by the first region and a second region of the active layer, depositing an planarizing layer on the active layer that defines a planar surface disposed on the active layer, etching to define nanowires and pads in the first region of the active layer, suspending the nanowires over the BOX layer, etching fins in the second region of the active layer forming a first gate stack that surrounds portion of each of the nanowires, forming a second gate stack covering a portion of the fins, and growing an epitaxial material wherein the epitaxial material defines source and drain regions of the nanowire FET and source and drain regions of the finFET.

20 Claims, 9 Drawing Sheets

US 8,536,029 B1

NANOWIRE FET AND FINFET

BACKGROUND

The present invention relates to integrated circuits, and more particularly, to hybrid nanowire field effect transistor (FET) and FinFET devices and methods for fabrication thereof.

Complementary metal-oxide semiconductor (CMOS) circuits typically include a combination of n-type and p-type field effect transistor (FET) devices. Each FET device includes a source, a drain and a channel between the source and the drain. A gate electrode over and/or surrounding the channel regulates electron flow between the source and the drain.

As feature sizes of CMOS circuits get increasingly smaller (commensurate with current technology) a number of challenges arise. For instance, scaling brings about issues related to electrostatics and mobility degradation in CMOS devices. A finFET architecture offers increased scaling opportunities beyond that attainable with planar devices. FinFET devices exhibit fast switching times and high current densities.

SUMMARY

According to one embodiment of the present invention, a method of fabricating a complementary metal-oxide semiconductor (CMOS) circuit having a nanowire field-effect transistor (FET) and a finFET includes providing a wafer having an active layer over a buried oxide (BOX), wherein the active layer includes at least a first region and a second region, thinning the first region of the active layer, for form a stepped surface in the active layer defined by the first region and the second region of the active layer, depositing an planarizing layer on the active layer that defines a planar surface disposed on the active layer, forming a first lithography hardmask on the organic planarizing layer over portions of the first region of the active layer and a second lithography hardmask on the planarizing layer over portions of the second region of the active layer, etching to define nanowires and pads in the first region of the active layer, suspending the nanowires over the BOX layer, etching fins in the second region of the active layer using the second lithography hardmask, forming a first gate stack that surrounds at least a portion of each of the nanowires, wherein the portions of each of the nanowires surrounded by the first gate stack define a channel region of a nanowire FET, forming a second gate stack covering at least a portion of each of the fins, wherein the portions of the fins covered by the second gate stack define a channel region of the finFET, and growing an epitaxial material on exposed portions of the nanowires, the pads and the fins, wherein the epitaxial material grown on the exposed portions of the nanowires and the pads define source and drain regions of the nanowire FET and wherein the epitaxial material grown on the exposed portions of the fins defines source and drain regions of the finFET.

A more complete understanding of the present invention, as well as further features and advantages of the present invention, will be obtained by reference to the following detailed description and drawings.

DETAILED DESCRIPTION OF THE PREFERRED EMBODIMENTS

FIGS. 1-16 illustrate an exemplary methodology for fabricating a complementary metal-oxide semiconductor (CMOS) circuit. The CMOS circuit includes an n-type field-effect transistor (NFET) device and a p-type FET (PFET) device. In the example now provided, the NFET device includes a nanowire FET architecture and the PFET includes a finFET architecture.

Figure 1:
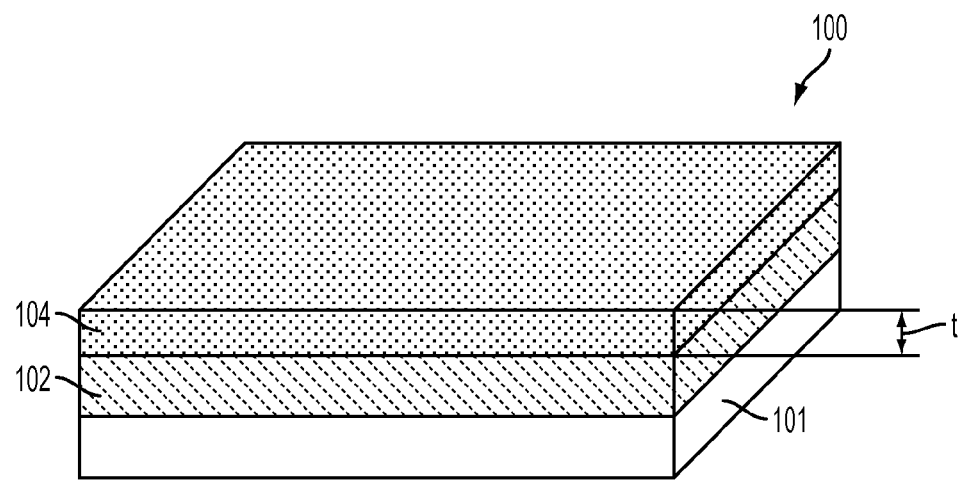
FIG. 1 is a three-dimensional diagram illustrating a structure for a complementary metal-oxide semiconductor (CMOS) circuit fabrication process.

Referring to FIG. 1, the fabrication process begins with a semiconductor-on-insulator (SOI) wafer 100. The SOI wafer 100 includes a layer of a semiconductor material (also commonly referred to as a semiconductor-on-insulator layer or SOI layer) separated from a substrate by an insulator. When the insulator is an oxide (e.g., silicon dioxide ($SiO_2$)), it is commonly referred to as a buried oxide, or BOX. According to the present techniques, the SOI layer will serve as an active layer of the device in which the nanowires and fins will be patterned. Thus, the SOI layer will be referred to herein as an active layer.

In the example shown in FIG. 1, the wafer 100 includes an active layer 104 disposed on a BOX 102. The BOX 102 is disposed on a substrate 101. According to an exemplary embodiment, the active layer 104 is formed from a semiconducting material, such as silicon (Si) (e.g., crystalline silicon), silicon germanium (SiGe) or germanium (Ge). Thus, the active layer 104 may also be referred to as a "semiconductor device layer" or simply as a "semiconductor layer."

Further, as will be apparent from the following description, a thickness t of active layer 104 will be equivalent to a final desired fin height for the PFET device. According to an exemplary embodiment, active layer 104 preferably has a thickness of from about 5 nanometers (nm) to about 40 nm. Commercially available SOI wafers typically have a thicker SOI layer. Thus, the SOI layer of a commercial wafer may be thinned using techniques such as oxidative thinning to achieve the desired active layer thickness for the present techniques.

Figure 2:
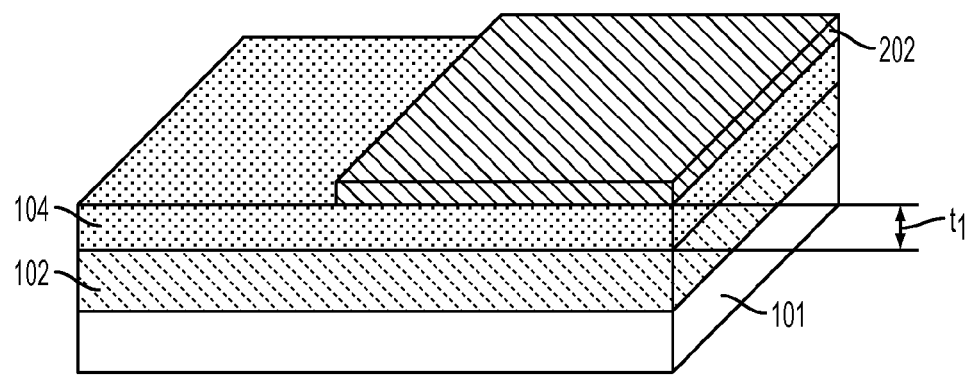
FIG. 2 is a three-dimensional diagram illustrating a hardmask having been formed over a portion of the wafer.

Referring to FIG. 2, a hardmask 202 is formed over a portion of the active layer 104 in which the PFET device will be formed. The hardmask 202 protects the region it covers during the active layer thinning step (described below). According to an exemplary embodiment, hardmask 202 is formed from a nitride hardmask material, such as silicon nitride (SiN) which is blanket deposited onto the active layer 104 using, e.g., low-pressure chemical vapor deposition (LPCVD), and then patterned using lithography and nitride-selective reactive ion etching (RIE) techniques known in the art to open up holes in (i.e., remove) the nitride hardmask in regions where the nanowire NFET device will be formed.

Figure 3:
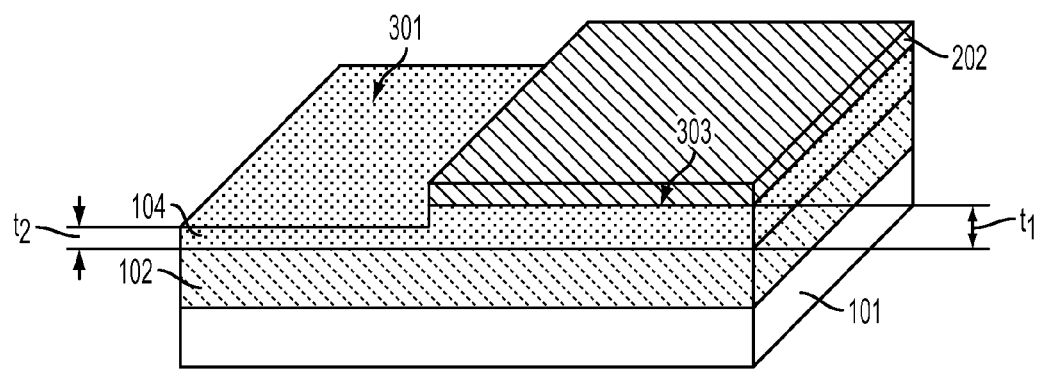
FIG. 3 is a three-dimensional diagram illustrating a thinned region of the active layer.

Referring to FIG. 3, a region 301 of the active layer 104 not masked by the hardmask 202 (i.e., the region that will be used to form the nanowire NFET device) is then thinned. According to an exemplary embodiment, the thinning is achieved using a timed RIE, which is selective for the material of the active layer 104 vis-á-vis the hardmask 202. Although, as shown in FIG. 3, the hardmask 202 may be thinned in the process in some embodiments. In the illustrated example, the active layer 104 is reduced in this process to a thickness t2 of from about 3 nm to about 20 nm. The result is vertical steps having been formed in the active layer 104 having a first thicker region 303 (i.e., having thickness t1) and a second thinner region 301 (i.e., having a thickness t2) having been formed in active layer 104. As described below, nanowires will be formed in this thinned region of the active layer 104.

Figure 4:
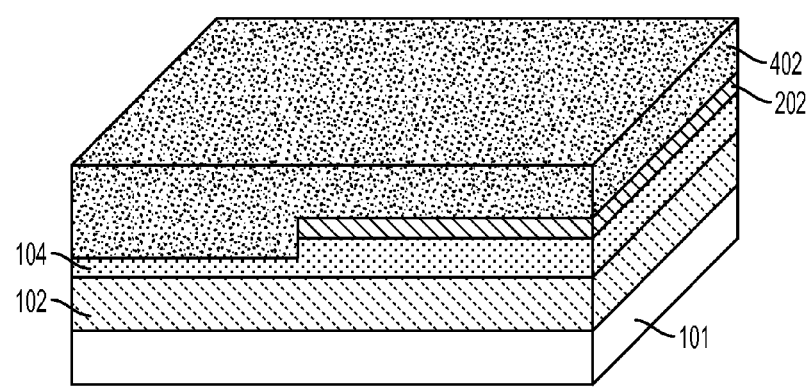
FIG. 4 is a three-dimensional diagram illustrating an organic planarizing layer.

Referring to FIG. 4, an organic planarizing layer 402 is spin-coated onto the stepped active layer 104. The organic planarizing layer 402 fills the stepped surface of the active layer 104, providing a flat planar surface for nanowire and fin patterning (described below). In the illustrated exemplary embodiment, the organic planarizing layer 402 is formed from an aromatic cross-linkable polymer (e.g., naphthalene-based) in a solvent and is coated onto the active layer 104 to a thickness of from about 30 nm to about 300 nm. Spin-coating allows the organic planarizing layer 402 to sufficiently fill the stepped topography of the active layer 104.

A post-apply bake is performed to cross-link the organic planarizing layer and bake off solvents. The post-apply bake may be, for example, conducted at a temperature of up to about 250 degrees Celsius (° C.), e.g., from about 200° C. to about 250° C.

Figure 5:
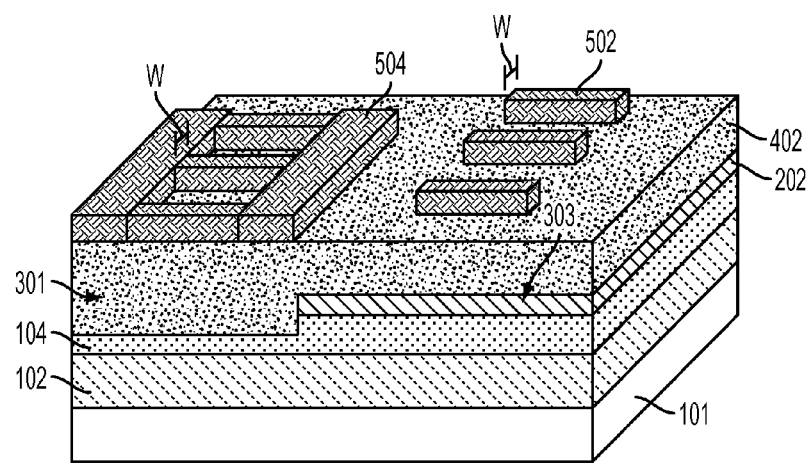
FIG. 5 is a three-dimensional diagram illustrating a fin lithography hardmask.

Standard lithography techniques are used to pattern a first hardmask 502, which will be used to pattern fins in the thicker region 303 of the active layer 104 (also referred to herein as a fin lithography hardmask) and a second hardmask 504, which will be used to pattern nanowires (and pads) in the thinner region 301 of the active layer 104 (also referred to herein as a nanowire/pad lithography hardmask). Since the organic planarizing layer 402 provides a continuous flat surface over the two regions of the active layer, the hardmasks 502 and 504 may be formed from a common material, using a single hardmask fabrication process. For example, a suitable hardmask material (e.g., a nitride material, such as SiN) may be blanket deposited over the organic planarizing layer 402 and patterned using a standard photolithography process with the footprint and location of hardmasks 502 and 504. As shown in FIG. 5, the fin lithography hardmask 502 is patterned on the organic planarizing layer 402 over the thicker region 303 of the active layer 104 and the nanowire/pad lithography hardmask 504 is patterned on the organic planarizing layer 402 over the thinner region 301 of the active layer 104.

The fin lithography hardmask 502 will dictate the dimensions and spacing (i.e., pitch, or distance between fins) in the final FinFET device. Thus, the fin lithography hardmask 502 is patterned with the desired dimensions and pitch commensurate with those of the fins. As shown in FIG. 5, the nanowire/pad hardmask 504 has a ladder-like configuration. This ladder-like configuration will be transferred to the active layer 104, wherein the nanowires will be patterned like rungs of a ladder interconnecting the pads (described below). The pads will be used to form source and drain regions of the nanowire FET. For some advanced patterning techniques such as sidewall image transfer, it may be preferable for the nanowires and fins to have the same lithographic width w.

Figure 6:
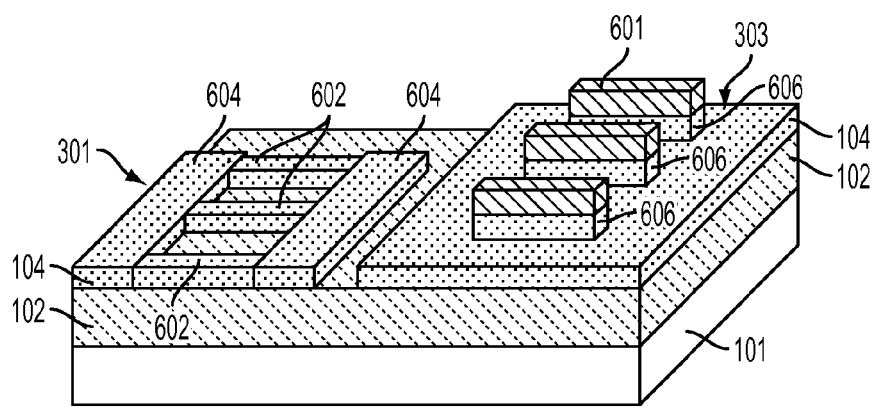
FIG. 6 is a three-dimensional diagram illustrating an etch.

Referring to FIG. 6, an etch through the hardmasks 502, 504, and the organic planarizing layer 402 is performed to form nanowires and pads in the thinner region 301 of the active layer 104 and only partially etch the fins in the thicker region of the active layer 104. For example, the etch may be performed using a series of RIE processes. For example, a first RIE process may be used that is selective for etching the organic planarizing layer 402. This first RIE process can be performed using, for example, an oxygen-containing, e.g., N2/O2 chemistry. A second RIE process may then be used to transfer the fin pattern into the hardmask 202, forming a patterned hardmask 601. The second RIE process may be performed using, for example, a CF4 etch chemistry. A third RIE process may be used to transfer the nanowire/fin pattern into the active layer 104. The third RIE step may be performed using, for example, a fluorine-containing, e.g., CHF3/CF4, or bromine chemistry. The third RIE is end-pointed when the nanowires 602 and pads 604 in the thinner region 301 of the active layer 104 are fully etched, and any remaining organic planarizing layer 402 is stripped with, for example, a wet strip or O2 plasma. At this point the fins 606 in the thicker region 303 of the active layer 104 are partially etched. Namely, this third etch process into the active layer 104 only extends part way through the thicker region 303 of the active layer 104. The remaining active layer protects the BOX 102 in the thicker region 303 during the process of undercutting the BOX 102 in the thinner region 301 below the nanowires 602 (described below).

As shown in FIG. 6, the nanowires 602 and pads 604 are formed having a ladder-like configuration. Namely, the pads are attached at opposite ends of the nanowires similar to the rungs of a ladder.

Figure 7:
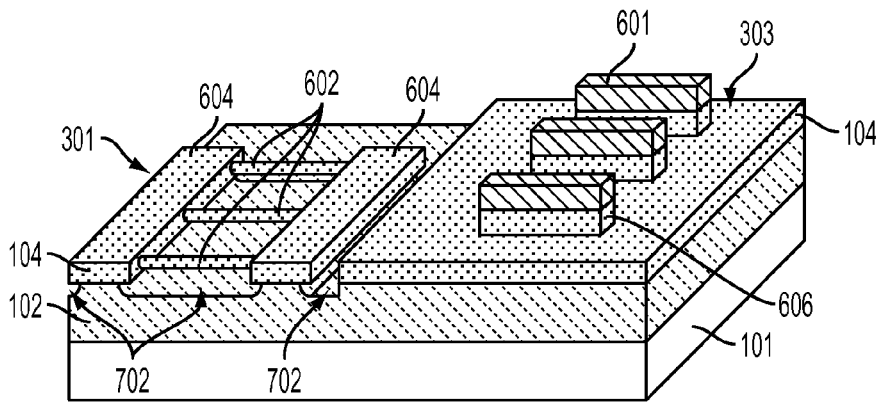
FIG. 7 is a three-dimensional diagram illustrating the nanowires suspended over the BOX.

In FIG. 7, the nanowires are suspended over the BOX 102. In the illustrated exemplary embodiment, the nanowires 602 are suspended by undercutting the BOX 102 beneath the nanowires 602 using an isotropic etching process. This process laterally etches portions of the BOX 102 under the pads 604 resulting in undercut regions 702 defined by the removal of portion of the BOX 102. The isotropic etching of the BOX 102 may be performed, for example, using a diluted hydrofluoric acid (DHF). A 100:1 DHF etches approximately 2 nm to 3 nm of BOX layer 102 per minute at room temperature. As highlighted above, the incomplete etch in the thicker active regions 303 where the fins are formed protects the fins from BOX undercut during this step.

Following the isotropic etching of the BOX 102 the nanowires 602 may be smoothed to give them an elliptical and in some cases a cylindrical cross-sectional shape. The smoothing of the nanowires 602 may be performed, for example, by annealing the nanowires 602 in a hydrogen-containing atmosphere. Exemplary annealing temperatures may be from about 600° C. to about 1,000° C., and a hydrogen pressure of from about 600 torr to about 700 torr may be employed.

Figure 8:
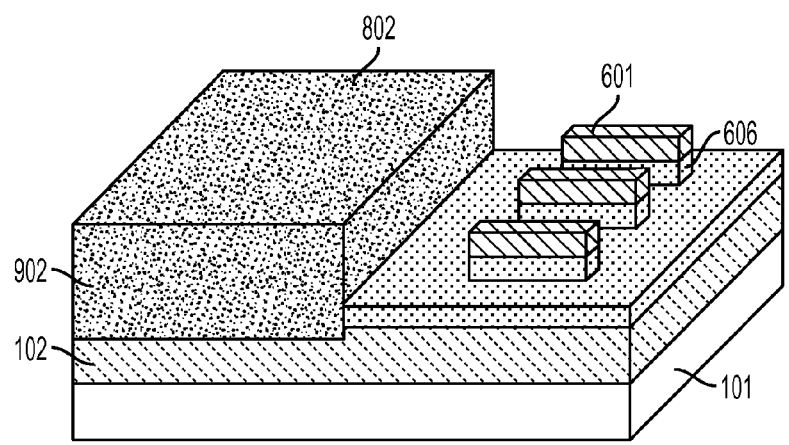
FIG. 8 is a three-dimensional diagram illustrating a resist layer.

Referring to FIG. 8, a resist layer 802 is formed over the nanowires 602 and pads 604 (of FIG. 7), to protect the nanowires 602 and pads 604 during etching of the fins. The resist 802 may be formed by coating a suitable resist material and patterning using lithography and etching processes. Exemplary resist materials include, for example, poly(methyl methacrylate) (PMMA).

Figure 9:
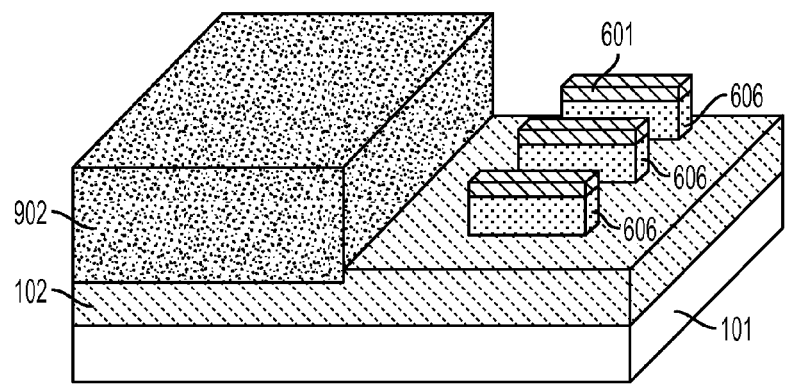
FIG. 9 is a three-dimensional diagram illustrating etching the fins.
Figure 10:
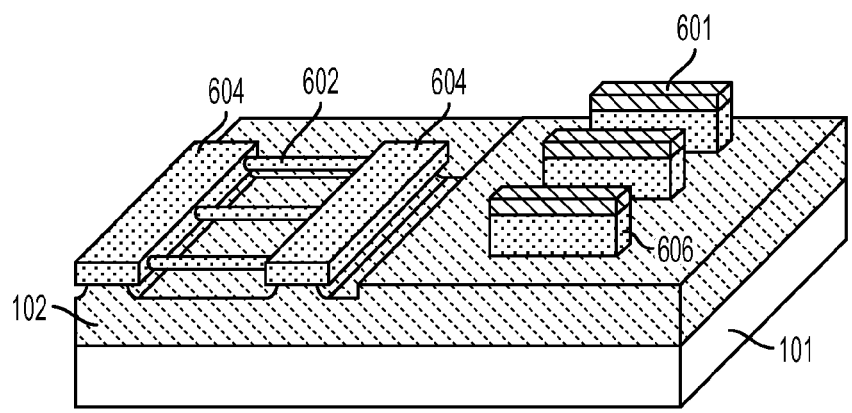
FIG. 10 is a three-dimensional diagram illustrating the removal of the resist layer.

FIG. 9 illustrates the resultant structure following an etching process that removes exposed portions of the active layer 104 (of FIG. 8) and completes the patterning of the fins 606. The etching process may include any suitable etching process such as, for example, a RIE process. The patterned hardmask 601 on the fins 606 is thinned during this fin etching process. The remaining patterned hardmask 601 may optionally be removed using for example an RIE process. Alternatively, as shown in the figures, the remaining patterned hardmask 601 may be removed later in the process.

Following the fin etch, the resist 802 (of FIG. 9) may be removed using, for example, a resist stripper. Suitable resist strippers include, for example, N-methyl pyrolidinone (NMP).

Figure 11:
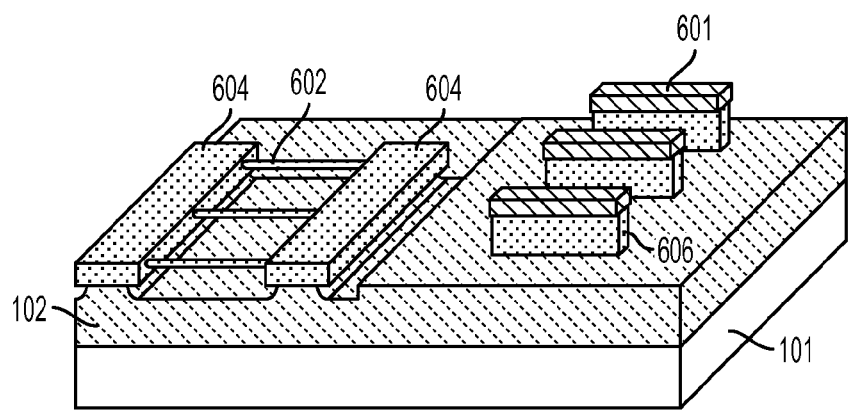
FIG. 11 is a three-dimensional diagram illustrating the nanowires and fins having optionally been thinned and smoothed.

Optionally, the nanowires 602 and fins 606 may be additionally thinned and smoothed as shown in FIG. 11. In this regard, in a similar manner as described above, the nanowires 602 may be re-shaped (e.g., smoothed) to an elliptical (e.g., circular) cross-sectional shape earlier in the process. The nanowires and fins may be thinned using a high-temperature (e.g., from about 700° C. to about-1,000° C.) oxidation of the nanowires 602 and fins 606 followed by etching of the grown oxide (not shown). The oxidation and etching process may be repeated x number of times to achieve desired nanowire 602 and fin 606 dimensions.

Figure 12:
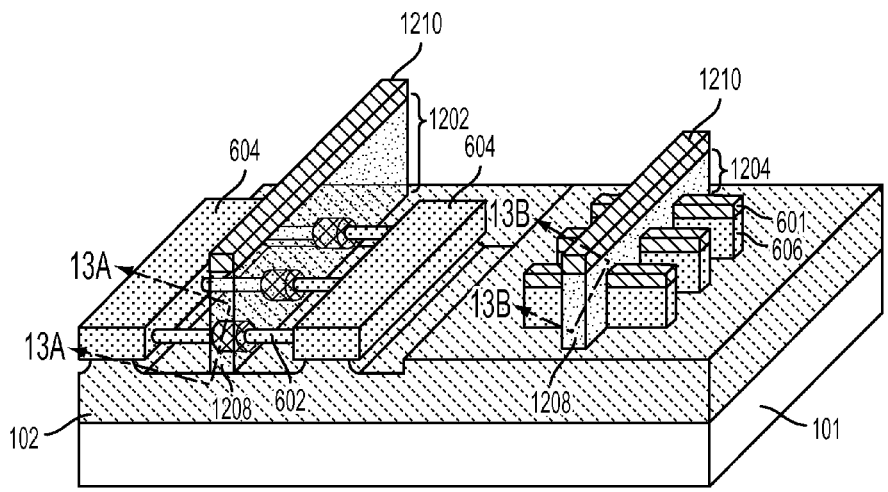
FIG. 12 is a three-dimensional diagram illustrating a gate stack.
Figure 13A:
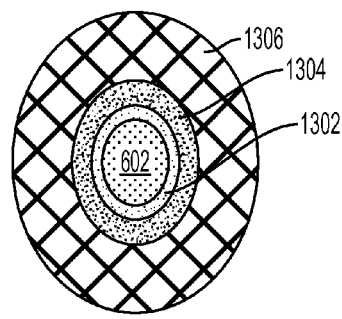
FIG. 13A is a cross-sectional diagram along the line 13A of FIG. 12.
Figure 13B:
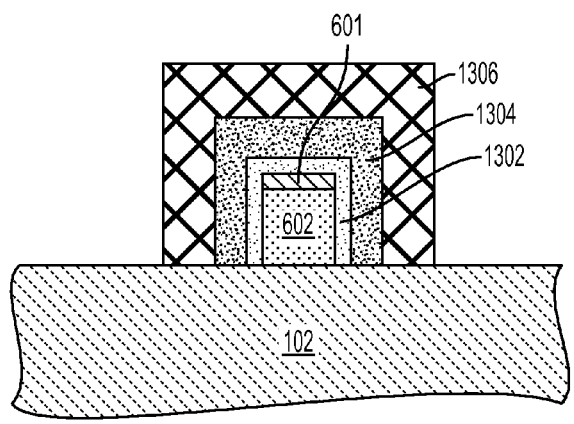
FIG. 13B is a cross-sectional diagram along the line 13B of FIG. 12.

FIG. 12 illustrates the resultant structure after a gate stack 1202 is patterned on the nanowires 602 and a gate stack 1204 is patterned on the fins 606. The portions of the nanowires 602 and fins 606 surrounded/covered by the gates stacks 1202 and 1204 respectively will serve as channel regions of the respective FET devices. The gate stack 1202 includes a dielectric (or combination of dielectrics), a first gate material (such as a metal(s)) and optionally a second gate material 1208 (such as a metal or doped polysilicon layer), all that surround the nanowires. Gate stack 1204 contains a dielectric (or combination of dielectrics), a first gate material (such as a metal(s)) and optionally a second gate material 1208 (such as a metal or doped polysilicon layer) that covers at least a portion of the fins, wherein the gate dielectric separates the gate materials 1208 from the fins. For example, as will be apparent from the following description, the second gate material 1208 in gate stack 1202 and the second gate material 1208 in gate stack 1204 are preferably formed from the same material that is deposited over both of the gate stacks and then patterned.

As shown in FIG. 12, since the nanowires have been suspended over the BOX as described above, gate stack 1202 completely surrounds at least a portion of each of the nanowires. This is referred to as a gate-all-around (GAA) configuration.

According to an exemplary embodiment, gate stacks 1202 and 1204 are formed by depositing a conformal gate dielectric film 1302 such silicon dioxide (SiO2), silicon oxynitride (SiON), or hafnium oxide (HfO2) (or other hi-K material) around both the nanowires (labeled "NW") and the fins, respectively. See FIG. 13A which provides a view of a cross-sectional cut (along line 13A of FIG. 12) through a portion of gate stack 1202 and FIG. 13B which provides a view of a cross-sectional cut (along line 13B, of FIG. 12) through a portion of gate stack 1204. Optionally, a second conformal gate dielectric film 1304 that includes, for example, HfO2, may be applied over gate dielectric film 1302. A (first) gate material 1306 is deposited over the conformal gate dielectric film 1302 (or over optional second conformal gate dielectric film 1304). According to an exemplary embodiment, the gate material 1306 is a conformal metal gate film that includes, for example, tantalum nitride (TaN) or titanium nitride (TiN).

Optionally, a second gate material such as doped polysilicon or metal may be blanket deposited onto the structure (i.e., over the gate material 1306 so as to surround portions of the nanowires 602 and fins 606. Referring to FIG. 12, hardmasks 1210 (e.g., a nitride hardmask, such as SiN) may then be formed on the second gate material 1208, wherein the hardmasks 1210 correspond to gate lines of the nanowire FET and FinFET. Standard patterning techniques can be used to form the hardmasks 1210. The gate material(s) and dielectric(s) are then etched by directional etching that results in straight sidewalls of the gate stacks 1202 and 1204, as shown in FIG. 12. The second gate material 1204, by this etching process, forms second gate material 1208 over gate stacks 1202 and 1204, respectively. If present, any remaining hardmask 601 on the fins 606 is also removed by the etching (illustrated in FIG. 14).

Figure 14:
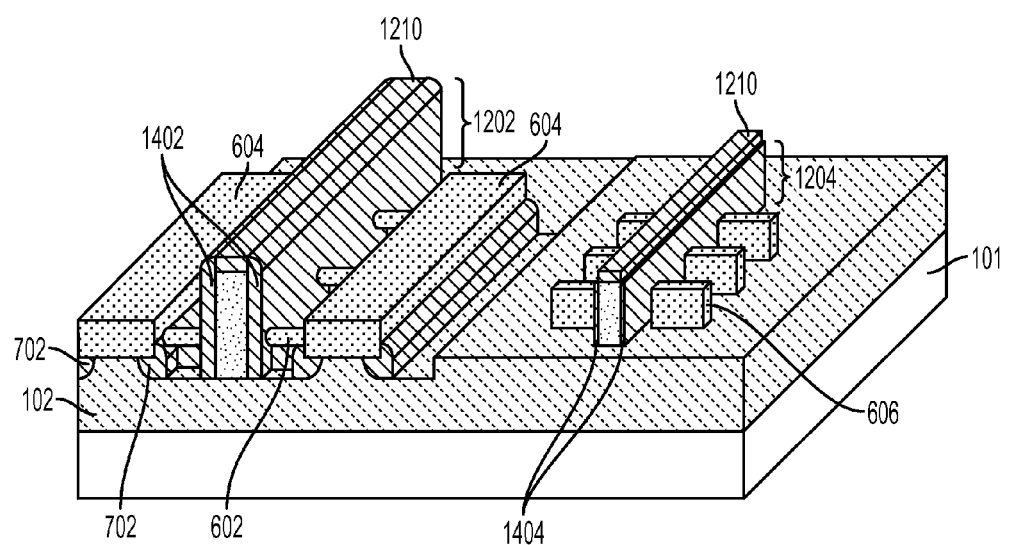
FIG. 14 is a three-dimensional diagram illustrating spacers.

Referring to FIG. 14, spacers 1402 are formed on opposing sides of gate stack 1202 and spacers 1404 are formed on opposing sides of gate stack 1204. In the illustrated exemplary embodiment, spacers 1402 and 1404 are formed by, for example, depositing a blanket dielectric film such as silicon nitride and etching the dielectric film from all horizontal surfaces by RIE. As shown in FIG. 14, some of the deposited spacer material may remain in the undercut regions 702, since the RIE in that region is blocked by the pads.

Figure 15:
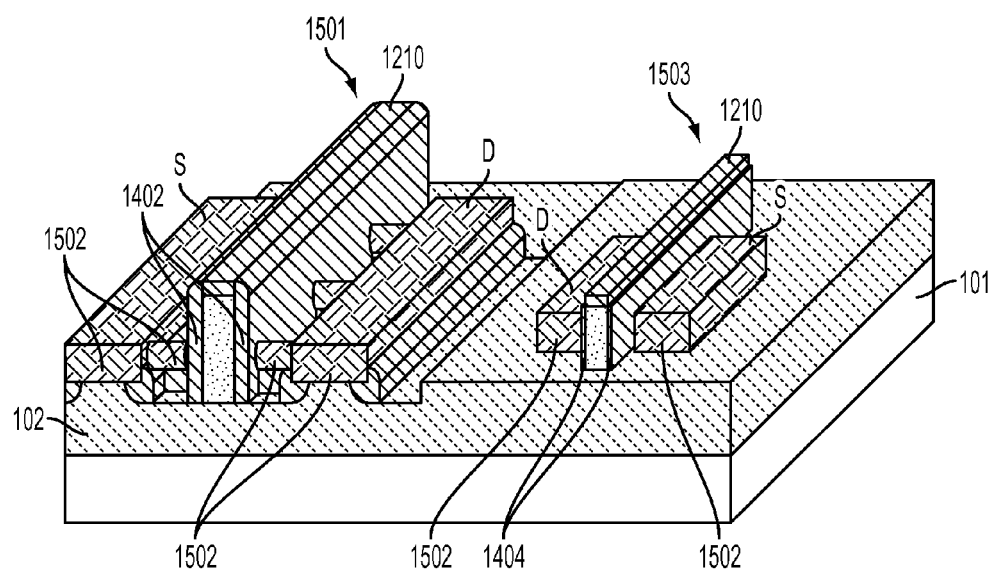
FIG. 15 is a three-dimensional diagram illustrating selective epitaxial silicon growth.

FIG. 15 illustrates the resultant structure following the growth of a selective epitaxial material such as silicon (Si), silicon germanium (SiGe), or silicon carbide (SiC) 1502 to thicken the exposed portions of the nanowires 602, pads 604 and fins 606 (i.e., those portions not covered by a gate stack or spacers). As shown in FIG. 15, the epitaxial silicon may merge the fins together with epitaxial silicon. The growth process might involve epitaxially growing, for example, in-situ doped Si or SiGe that may be either n-type or p-type doped. The in-situ doped epitaxial growth process forms source (S) and drain (D) regions of the nanowire FET 1501 and of the FinFET 1503. For example, a chemical vapor deposition (CVD) reactor may be used to perform the epitaxial growth. For example, for silicon epitaxy, precursors include, but are not limited to, SiCl4, SiH4 combined with HCL. The use of chlorine allows selective deposition of silicon only on exposed silicon. A precursor for SiGe growth may be GeH4, which may obtain deposition selectivity without HCL. Precursors for dopants may include PH3 or AsH3 for n-type doping and B2H6 for p-type doping. Deposition temperatures may range from about 550° C. to about 1,000° C. for pure silicon deposition, and as low as 300° C. for pure Ge deposition.

Figure 16:
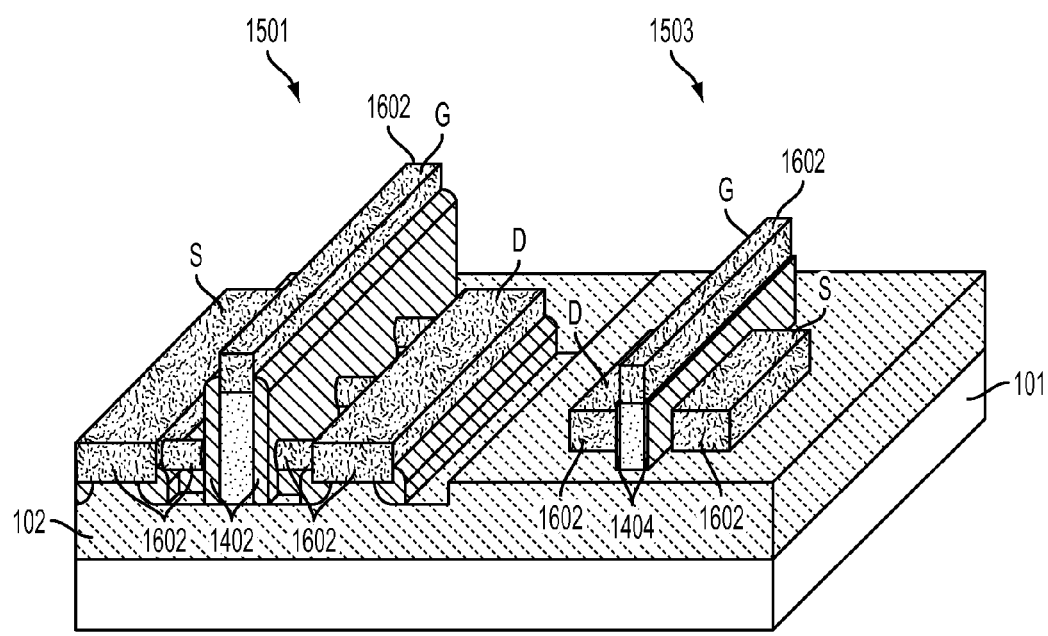
FIG. 16 is a three-dimensional diagram illustrating a silicide formation.

FIG. 16 illustrates the resultant structure following the formation of a contact material such as a silicide, germanide, germanosilicide, etc. 1602 that is formed on the exposed epitaxial silicon 1502. Examples of contact materials include, but are not limited to, nickel silicide or cobalt silicide. When nickel (Ni) is used, the nickel silicide phase is formed due to its low resistivity. By way of example only, formation temperatures can be from about 400° C. to about 600° C. Once the contact material formation is performed, capping layers and vias for connectivity (not shown) may be formed.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of fabricating a complementary metal-oxide semiconductor (CMOS) circuit having a nanowire field-effect transistor (FET) and a finFET, the method comprising:
   providing a wafer having an active layer over a buried oxide (BOX), wherein the active layer includes at least a first region and a second region;
   thinning the first region of the active layer, for forming a stepped surface in the active layer defined by the first region and the second region of the active layer;
   depositing an organic planarizing layer on the active layer that defines a planar surface disposed on the active layer;
   forming a first lithography hardmask on the organic planarizing layer over portions of the first region of the active layer and a second lithography hardmask on the organic planarizing layer over portions of the second region of the active layer;
   etching to define nanowires and pads in the first region of the active layer;
   suspending the nanowires over the BOX layer;
   etching fins in the second region of the active layer using the second lithography hardmask;
   forming a first gate stack that surrounds at least a portion of each of the nanowires, wherein the portions of each of the nanowires surrounded by the first gate stack define a channel region of a nanowire FET;
   forming a second gate stack covering at least a portion of each of the fins, wherein the portions of the fins covered by the second gate stack define a channel region of the finFET; and
   simultaneously growing an epitaxial material on exposed portions of the nanowires, the pads and the fins, wherein the epitaxial material grown on the exposed portions of the nanowires and the pads define source and drain regions of the nanowire FET and wherein the epitaxial material grown on the exposed portions of the fins defines source and drain regions of the finFET.

2. The method of claim 1, further comprising forming a hardmask on the second region of the active layer prior to thinning the first region of the active layer.

3. The method of claim 2, wherein forming the hardmask comprises:
   depositing a hardmask material onto the active layer; and
   removing a portion of the hardmask material from the first region of the active layer to expose the first region of the active layer.

4. The method of claim 1, further comprising depositing a resist that covers and protects the nanowires prior to etching the fins in the second region of the active layer.

5. The method of claim 1, wherein the fins are partially etched in the second region of the active layer during the etching of the nanowires and the pads in the first region of the active layer.

6. The method of claim 1, further comprising forming spacers on opposing sides of the first gate stack and on opposing sides of the second gate stack.

7. The method of claim 1, wherein the active layer comprises a semiconducting material selected from a group consisting of: silicon, germanium and silicon germanium.

8. The method of claim 1, wherein the first region of the active layer is thinned using a timed reactive ion etching process.

9. The method of claim 1, wherein the organic planarizing layer is deposited on the active layer using a spin coating process.

10. The method of claim 1, wherein the nanowires are suspended over the BOX layer by removing portions of the BOX layer beneath the nanowires.

11. The method of claim 10, wherein the BOX layer beneath the nanowires is removed using an isotropic etching process.

12. The method of claim 1, further comprising annealing the nanowires to smoothen the nanowires.

13. The method of claim 12, wherein the annealing is performed at a temperature of approximately 600° C. to approximately 1,000° C. in an atmosphere containing hydrogen.

14. The method of claim 1, wherein the forming the first gate stack comprises:
   depositing a conformal gate dielectric film around the nanowires;
   depositing a conformal metal gate film over the conformal gate dielectric film;
   depositing polysilicon over the conformal metal gate film; and
   patterning the polysilicon, the conformal gate dielectric film and the conformal metal gate film to form the first gate stack.

15. The method of claim 14, wherein the conformal gate dielectric film is selected from a group consisting of: silicon dioxide, silicon oxynitride and hafnium oxide.

16. The method of claim 14, wherein the conformal metal gate film is selected from a group consisting of: tantalum nitride and titanium nitride.

17. The method of claim 1, wherein forming the second gate stack comprises:
   depositing a gate dielectric over the fins;
   depositing polysilicon over the gate dielectric; and
   patterning the polysilicon and the gate dielectric to form the second gate stack.

18. The method of claim 1, further comprising forming a contact material on the epitaxial material.

19. The method of claim 18, wherein the contact material comprises a silicide, germanide or germanosilicide material.

20. The method of claim 1, further comprising thinning the nanowires after suspending the nanowires by:
   oxidizing the nanowires to form an oxide on the nanowires; and
   etching the oxide formed on the nanowires.

* * * * *